(12) United States Patent
Beak et al.

(10) Patent No.: US 10,263,053 B2
(45) Date of Patent: Apr. 16, 2019

(54) ORGANIC LIGHT-EMITTING DIODE DISPLAY AND METHOD FOR MANUFACTURING THE SAME

(71) Applicant: LG DISPLAY CO., LTD., Seoul (KR)

(72) Inventors: Jungsun Beak, Paju-si (KR); Jeongoh Kim, Goyang-si (KR); Namyong Kim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 4 days.

(21) Appl. No.: 14/935,964

(22) Filed: Nov. 9, 2015

(65) Prior Publication Data

US 2016/0133678 A1 May 12, 2016

(30) Foreign Application Priority Data

Nov. 10, 2014 (KR) .................. 10-2014-0155724

(51) Int. Cl.
| | |
|---|---|
| H01L 27/32 | (2006.01) |
| H01L 51/56 | (2006.01) |
| H01L 29/08 | (2006.01) |
| H01L 35/24 | (2006.01) |
| H01L 51/00 | (2006.01) |

(52) U.S. Cl.
CPC ...... H01L 27/3246 (2013.01); H01L 27/3248 (2013.01); H01L 27/3262 (2013.01); H01L 51/56 (2013.01); H01L 2227/323 (2013.01)

(58) Field of Classification Search
CPC ............. H01L 27/3246; H01L 27/3244; H01L 27/3211; H01L 27/3248; H01L 27/3258; H01L 27/3262; H01L 51/0003; H01L 51/0018; H01L 51/5012; H01L 51/5206; H01L 51/56; H01L 2227/323
USPC .................................. 257/40, 59; 438/34, 99
See application file for complete search history.

(56) References Cited

U.S. PATENT DOCUMENTS

| | | | |
|---|---|---|---|
| 2005/0186698 A1 | 8/2005 | Ishida et al. | |
| 2007/0210303 A1 | 9/2007 | Ikeda et al. | |
| 2008/0067519 A1* | 3/2008 | Sakurai | G02F 1/136213 257/72 |
| 2008/0100788 A1* | 5/2008 | Yang | G02F 1/136213 349/143 |
| 2008/0287028 A1* | 11/2008 | Ozawa | H01L 51/56 445/24 |
| 2010/0072882 A1* | 3/2010 | Hwang | H01L 51/5265 313/504 |
| 2010/0309172 A1* | 12/2010 | Oh | H01L 27/3246 345/204 |
| 2012/0049169 A1* | 3/2012 | Kim | H01L 27/3246 257/40 |

(Continued)

FOREIGN PATENT DOCUMENTS

| | | |
|---|---|---|
| CN | 101145566 A | 3/2008 |
| EP | 0935229 A1 | 8/1999 |

*Primary Examiner* — Nduka E Ojeh
(74) *Attorney, Agent, or Firm* — Dentons US LLP

(57) ABSTRACT

Provided is an OLED display that includes, for example, a substrate having a plurality of pixel regions defined in a matrix; a thin film transistor in each pixel region; an anode connected to the thin film transistor in each pixel region; and a bank covering an edge of the anode and having an inside boundary at a first distance from the edge of the anode and an outside boundary at a second distance from the edge of the anode.

4 Claims, 11 Drawing Sheets

(56) References Cited

U.S. PATENT DOCUMENTS

| | | | |
|---|---|---|---|
| 2013/0249383 A1* | 9/2013 | Yoo | H05B 33/22 313/504 |
| 2013/0299789 A1* | 11/2013 | Yamazaki | H01L 51/5246 257/40 |
| 2014/0203262 A1* | 7/2014 | Kwak | G09G 3/3233 257/40 |
| 2015/0188083 A1* | 7/2015 | Jang | H01L 27/124 257/40 |

* cited by examiner

ORGANIC LIGHT-EMITTING DIODE DISPLAY AND METHOD FOR MANUFACTURING THE SAME This application claims the benefit of Korean Patent Application No. 10-2014-0155724, filed on Nov. 10, 2014, which is incorporated herein by reference for all purposes as if fully set forth herein.

BACKGROUND OF THE INVENTION

Field of the Invention

The present invention relates to an organic light-emitting diode (OLED) display and a method for manufacturing the same. More specifically, the present invention relates to an organic light-emitting diode display and a method for manufacturing the same that can reduce a number of mask processes.

Discussion of the Related Art

Recently, a variety of flat panel displays having reduced weight and volume, as compared to cathode ray tubes, have been developed. Such flat panel displays include liquid crystal displays (LCDs), field emission displays (FEDs), plasma display panels (PDPs), electroluminescent devices (ELs) and the like.

ELs are classified into an inorganic EL and an organic light-emitting diode display. ELs are a self-emissive device, and as such, they have various advantages, such as fast response speed, high luminous efficiency and brightness and wide viewing angle.

FIG. 1 illustrates a structure of an organic light-emitting diode according to the related art. As show in FIG. 1, the organic light-emitting diode includes an organic electroluminescent compound layer, a cathode and an anode opposite to each other having the organic electroluminescent compound layer interposed therebetween. The organic electroluminescent compound layer includes a hole injection layer (HIL), a hole transport layer (HTL), an emission layer (EML), an electron transport layer (ETL) and an electron injection layer (EIL).

The organic light-emitting diode emits light according to energy from excitons generated through a process in which holes and electrons injected from the anode and the cathode are recombined in the EML. An organic light-emitting diode display displays images by electrically controlling the quantity of light generated in the EML of the organic light-emitting diode as shown in FIG. 1.

Organic light-emitting diode (OLED) displays, which use the characteristics of such an organic light-emitting diode, can be classified into a passive matrix type organic light-emitting diode (PMOLED) display and an active matrix type organic light-emitting diode (AMOLED) display.

The AMOLED display displays images by controlling the amount of current flowing through organic light-emitting diodes using thin film transistors.

FIG. 2 is an equivalent circuit diagram illustrating a structure of one pixel of an AMOLED display, FIG. 3 is a plan view of a structure of one pixel of the AMOLED display, and FIG. 4 is a cross-sectional view illustrating a structure of one pixel of the AMOLED display, taken along line I-I' of FIG. 3.

Referring to FIGS. 2 and 3, an AMOLED includes a switching thin film transistor ST, a driving thin film transistor DT connected to the switching thin film transistor ST and an organic light-emitting diode OLED in contact with the driving thin film transistor DT.

The switching thin film transistor ST is formed at an intersection of a scan line SL and a data line DL, and serves to select a pixel. The switching thin film transistor ST includes a gate electrode SG, a semiconductor layer SA, a source electrode SS and a drain electrode SD. The driving thin film transistor DT drives an organic light-emitting diode OLED of a pixel selected by the switching thin film transistor ST. The driving thin film transistor DT includes a gate electrode DG connected to the drain electrode SD of the switching thin film transistor ST, a semiconductor layer DA, a source electrode DS connected to a driving current line VDD and a drain electrode DD. The drain electrode DD of the driving thin film transistor DT is connected to an anode ANO of the organic light-emitting diode OLED.

More specifically, referring to FIG. 4, the gate electrodes SG and DG of the switching thin film transistor ST and the driving thin film transistor DT are formed on a substrate SUB of the AMOLED. A gate insulating layer GI is formed on the gate electrodes SG and DG. The semiconductor layers SA and DA are formed on portions of the gate insulating layer GI, which correspond to the gate electrodes SG and DG. The source electrode SS and the drain electrode SD are formed on the semiconductor layer SA, opposite to each other having a predetermined gap provided therebetween. The source electrode DS and the drain electrode DD are formed on the semiconductor layer DA, opposite to each other having a predetermined gap provided therebetween. The drain electrode SD of the switching thin film transistor ST is connected to the gate electrode DG of the driving thin film transistor DT via a contact hole formed in the gate insulating layer GI. A passivation layer PAS is formed on the overall surface of the substrate so as to cover the switching thin film transistor ST and the driving thin film transistor DT having the aforementioned structure.

When the semiconductor layers SA and DA are formed of an oxide semiconductor material, a large-sized OLED display having high resolution, large charging capacity and fast driving speed can be achieved due to the oxide semiconductor's high mobility. The oxide semiconductor material layers may further include etch stoppers SE and DE for protecting the surfaces thereof from an etchant in order to ensure device stability. Specifically, the etch stoppers SE and DE are formed so as to reduce or prevent the semiconductor layers SA and DA from being back-etched due to an etchant contacting the exposed surfaces of the semiconductor layers SA and DA, which correspond to the gaps between the source electrodes SS and DS and the drain electrodes SD and DD.

A color filter CF is formed in a region corresponding to the anode ANO which will be formed later. The color filter CF is preferably formed to occupy a wide area if possible. For example, the color filter CF is formed such that the color filter CF is superposed on a wide area including the data line DL, driving current line VDD and scan line SL. The substrate on which the color filter CF has been formed typically has an uneven surface due to stepped portions since many components have been formed thereon. Accordingly, an overcoat layer OC is formed on the overall surface of the substrate in order to planarize the surface of the substrate.

Subsequently, the anode ANOP of the OLED is formed on the overcoat layer OC. Here, the anode ANO is connected to the drain electrode DD of the driving thin film transistor DT via a contact hole formed in the overcoat layer OC and the passivation layer PAS.

A bank pattern BN for defining a pixel region is formed on the switching thin film transistor ST, the driving thin film transistor DT and the interconnection lines DL, SL and VDD formed on the substrate on which the anode ANO is formed.

The anode ANO exposed through the bank pattern BN becomes an emission area. An organic emission layer OLE and a cathode layer CAT are sequentially formed on the anode ANO exposed through the bank pattern BN. When the organic emission layer OLE is formed of an organic material emitting a white light, the organic emission layer OLE expresses a color assigned to each pixel according to the color filter CF located under the organic emission layer OLE. In this manner, the OLED display is completed.

To manufacture such an OLED display, photolithography processes using photo-masks are performed multiple times. Each mask process typically includes cleaning, exposure, development, etching and the like.

When the number of mask processes increases, time and costs for manufacturing an OLED display and defect generation rate increase, thereby decreasing production yield. Accordingly, it would be beneficial to reduce the number of mask processes in order to decrease manufacturing costs and improve production yield and production efficiency.

SUMMARY OF THE INVENTION

Accordingly, the present invention is directed to an organic light-emitting diode (OLED) display and a method for manufacturing the same that substantially obviate one or more problems due to limitations and disadvantages of the related art.

An advantage of the present invention is directed to an OLED display and a method for manufacturing the same that can reduce a number of mask processes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an OLED display may, for example, include a substrate having a plurality of pixel regions defined in a matrix; a thin film transistor in each pixel region; an anode connected to the thin film transistor in each pixel region; and a bank covering an edge of the anode and having an inside boundary at a first distance from the edge of the anode and an outside boundary at a second distance from the edge of the anode.

In another aspect of the present disclosure, a method for manufacturing an OLED display may, for example, include forming a thin film transistor on a substrate; forming an overcoat layer on the thin film transistor; forming a pixel contact hole partially exposing the thin film transistor; sequentially providing an anode material and a photosensitive insulating material on the overcoat layer, and patterning the anode material and the photosensitive insulating material in a single mask process to form an anode connected to the thin film transistor through the pixel contact hole; and removing the photosensitive insulating material to form a bank exposing a part of the anode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts. A detailed description of known functions and configurations incorporated herein will be omitted when it may make embodiments of the present invention rather unclear.

A description will be given of an organic light-emitting diode (OLED) display according to an embodiment of the present invention with reference to FIGS. 5 and 6.

Figure 1:
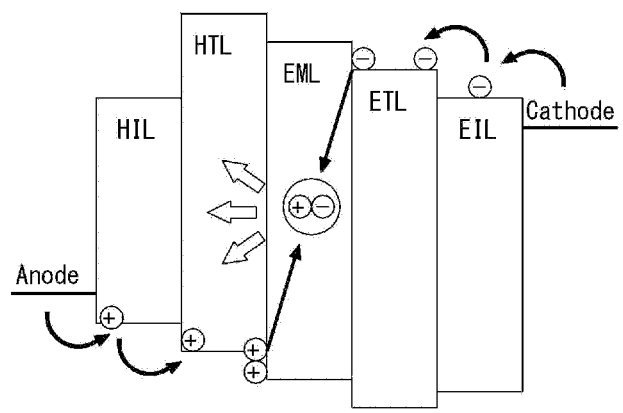
FIG. 1 illustrates an organic light-emitting diode display according to the related art.
Figure 2:
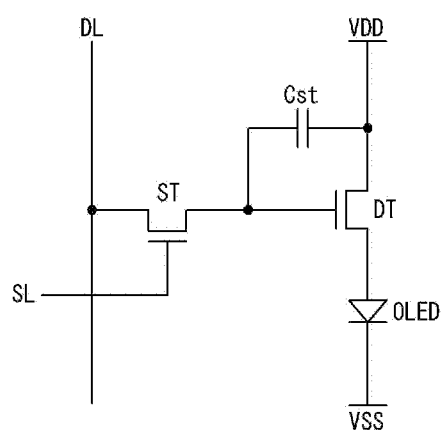
FIG. 2 is an equivalent circuit diagram illustrating a structure of one pixel of an organic light-emitting diode display according to the related art.
Figure 3:
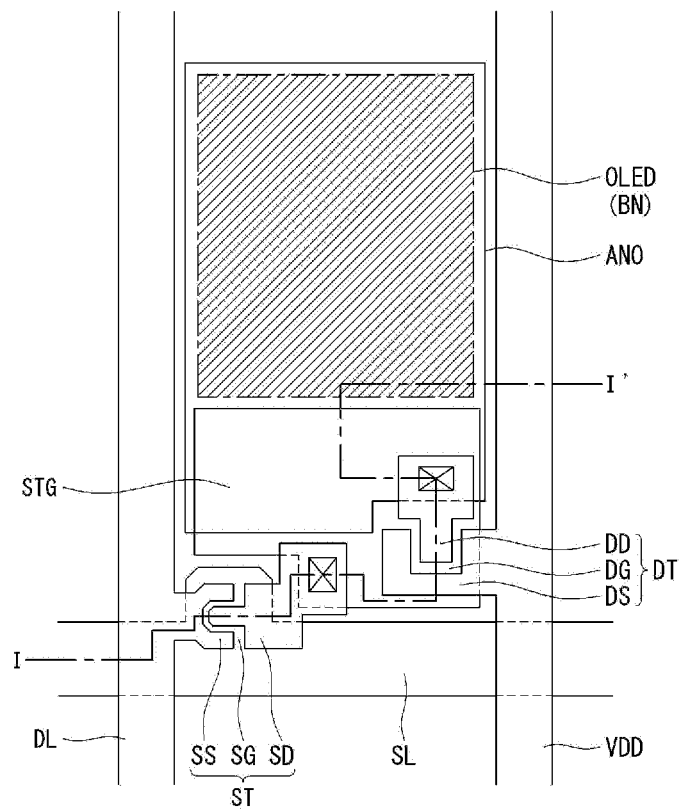
FIG. 3 is a plan view illustrating a structure of one pixel of an organic light-emitting diode display according to the related art.
Figure 4:
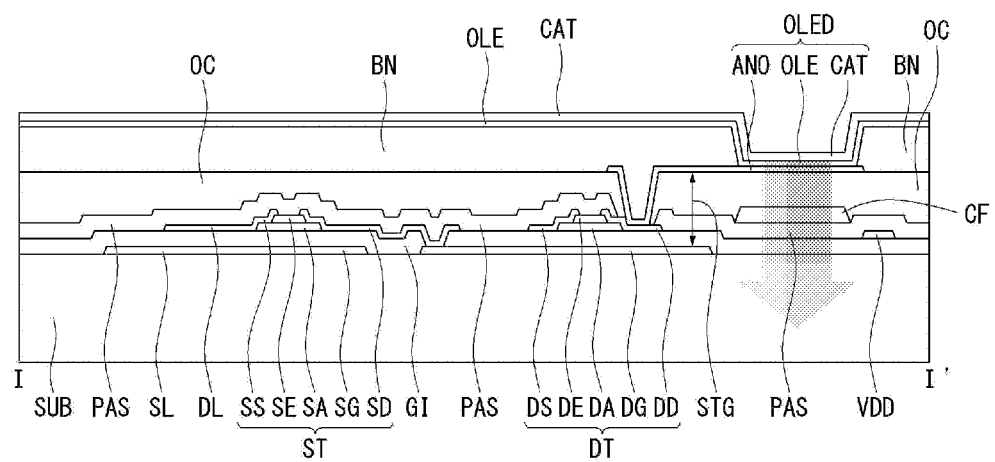
FIG. 4 is a cross-sectional view illustrating a structure of one pixel of the organic light-emitting diode display, taken along line I-I' of FIG. 3.
Figure 5:
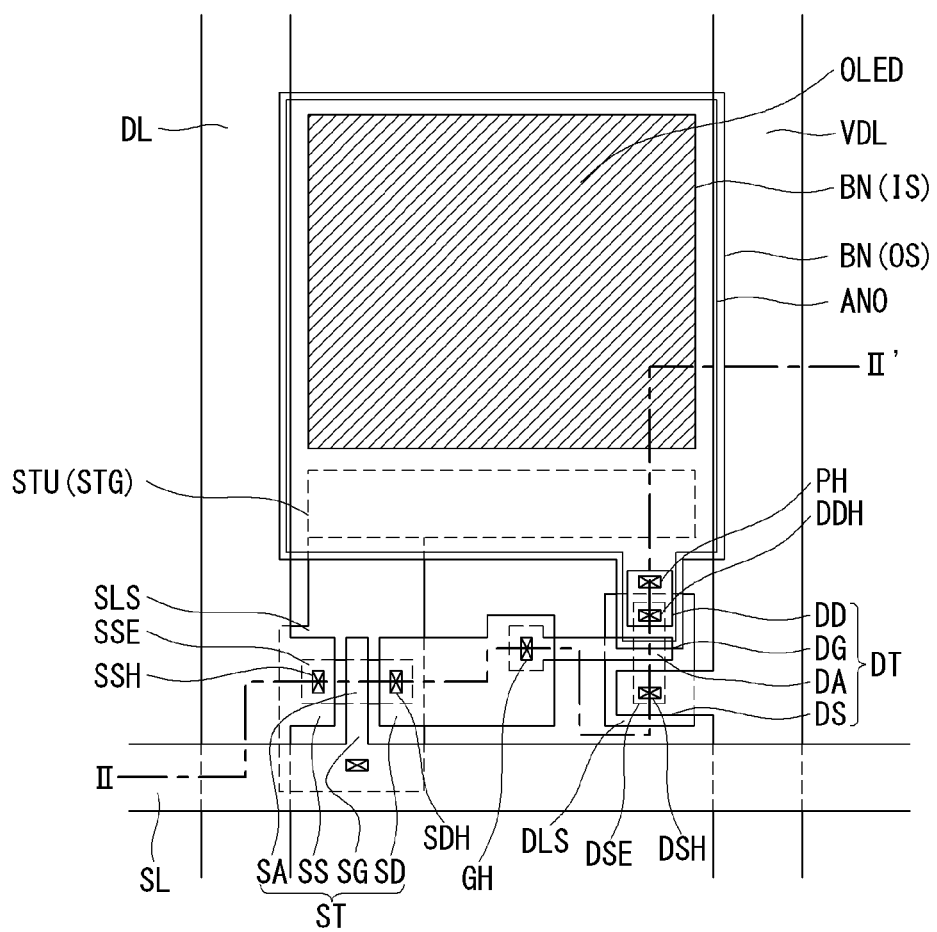
FIG. 5 is a plan view illustrating a structure of an organic light-emitting diode display according to an embodiment of the present invention.
Figure 6:
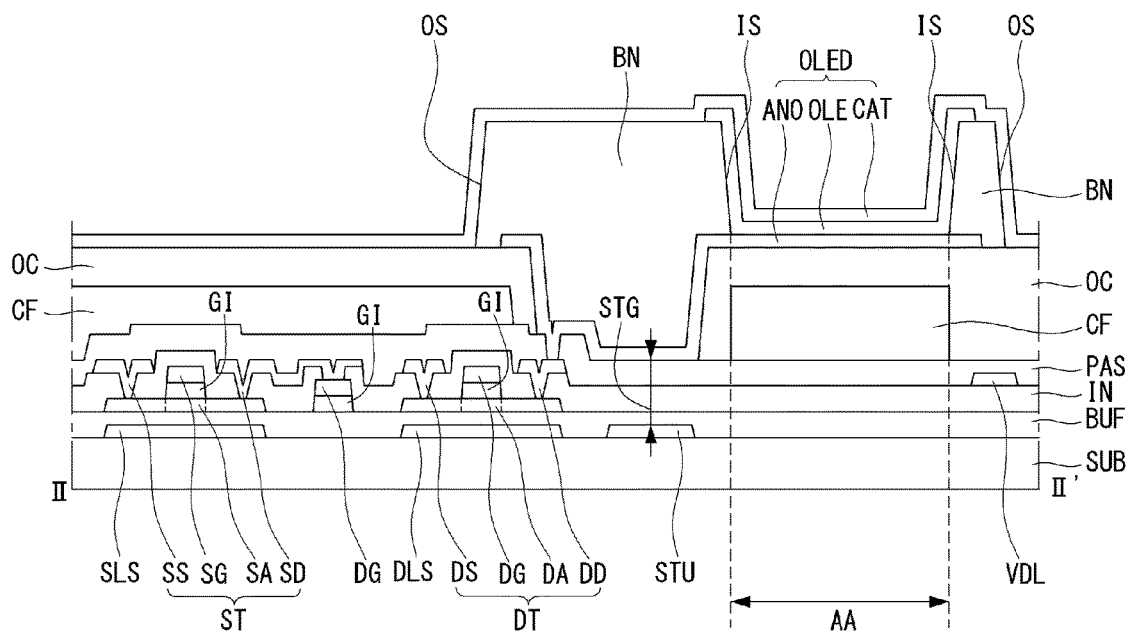
FIG. 6 is a cross-sectional view illustrating a structure of the organic light-emitting diode display, taken along line II-II' of FIG. 5.

FIG. 5 is a plan view illustrating a structure of an OLED display according to an embodiment of the present invention, and FIG. 6 is a cross-sectional view illustrating a structure of the organic light-emitting diode display, taken along line II-II' of FIG. 5.

The OLED display includes a switching thin film transistor ST, a driving thin film transistor DT connected to the switching thin film transistor ST and an organic light-emitting diode OLED connected to the driving thin film transistor DT. The switching thin film transistor ST is formed near a crossing between a scan line SL and a data line DL and serves to select a pixel. The switching thin film transistor ST includes a switching gate electrode SG connected to the scan line SL, a switching source electrode SS branched from the data line DL, a switching drain electrode SD and a switching semiconductor layer SSE defining a switching channel region SA.

The driving thin film transistor DT serves to drive the organic light-emitting diode OLED of a pixel selected by the switching thin film transistor ST. The driving thin film transistor DT includes a driving gate electrode DG connected to the switching gate electrode SG of the switching thin film transistor ST, a driving source electrode DS branched from a driving current line VDL, a driving drain electrode DD and a driving semiconductor layer DSE defining a driving channel region DA. The driving drain electrode DD of the driving thin film transistor DT is connected to an anode ANO of the organic light-emitting diode OLED through a pixel contact hole PH.

Light-shielding layers SLS and DLS are respectively formed under the switching thin film transistor ST and the driving thin film transistor DT. The light-shielding layers SLS and DLS are formed to protect oxide semiconductor elements from external light when the semiconductor layers SSE and DSE are formed using an oxide semiconductor material. Here, the switching light-shielding layer SLS and the driving light-shielding layer DLS may be connected and integrated into one body. In addition, the light-shielding layers SLS and DLS may be connected to the gate electrodes SG and DG so as to form a double gate structure.

A storage capacitor lower electrode STU may be formed along with the light-shielding layers SLS and DLS. A storage capacitor STG can be formed by the storage capacitor lower electrode STU and the anode ANO superposed on the storage capacitor lower electrode STU having insulating layers interposed therebetween.

A bank BN is formed on the anode ANO. The bank BN is formed to cover the edge of the anode ANO and has an inside boundary IS at a predetermined distance from the edge of the anode ANO and an outside boundary OS at a predetermined distance from the edge of the anode ANO. A part of the anode ANO, exposed through the inside boundary IS, is defined as an emission area AA. The bank BN having the inside boundary IS and the outside boundary OS is formed to cover the surface and side of the anode ANO except the emission area AA. In the OLED display according to an embodiment of the present invention, the bank BN defines the emission region AA and covers the storage capacitor STG and the pixel contact hole PH, which correspond to a non-emission area, in the region in which the anode ANO is formed.

More specifically, the switching light-shielding layer SLS, the driving light-shielding layer DSL and the storage capacitor lower electrode STU are formed on a substrate SUB. The switching light-shielding layer SLS is formed in a region in which the switching thin film transistor ST will be formed and the driving light-shielding layer DLS is formed in a region in which the driving thin film transistor DT will be formed. In addition, the storage capacitor lower electrode STU is formed in a region in which the storage capacitor STG will be formed.

A buffer layer BUF is formed on the light-shielding layers SLS and DSL and the storage capacitor lower electrode STU so as to cover an overall surface of the substrate SUB. Semiconductor layers SSE and DSE are formed on the buffer layer BUF. Channel regions of the semiconductor layers SSE and DSE are beneficially formed to be respectively superposed on the light-shielding layers SLS and DLS. That is, the switching channel region SA is superposed on the switching light-shielding layer SLS, and the driving channel region DA is superposed on the driving light-shielding layer DLS. A gate insulating layer GI and gate electrodes SG and DG are formed on the switching channel region SA and the driving channel region DA.

An interlevel insulating layer IN is formed on an overall surface of the substrate SUB on which the gate electrodes SG and DG are formed. The switching source electrode SS branched from the data line DL and the switching drain electrode SD disposed opposite the switching source electrode SS are formed on the interlevel insulating layer IN. The switching source electrode SS is connected to one side of the switching semiconductor layer SSE through a switching source contact hole SSH. The switching drain electrode SD is connected to the other side of the switching semiconductor layer SSE through a switching drain contact hole SDH. In addition, the driving source electrode DS branched from the driving current line VDL and the driving drain electrode DD disposed opposite the driving source electrode DS are formed on the interlevel insulating layer N. The driving source electrode DS is connected to one side of the driving semiconductor layer DSE through a driving source contact hole DSH. The driving drain electrode DD is connected to the other side of the driving semiconductor layer DSE through a driving drain contact hole DDH. In this manner, the switching thin film transistor ST and the driving thin film transistor DT are completed. Here, the switching drain electrode SD is connected to the driving gate electrode DG through a gate contact hole GH.

A passivation layer PAS is formed on the overall surface of the substrate SUB on which the thin film transistors ST and DT are formed. Color filters CF can be disposed in the emission area AA on the passivation layer PAS. One of red, green and blue color filters CF is disposed at each pixel. The red, green and blue color filters CF may be sequentially disposed. The color filters CF may further include a white color filter CF in addition to the red, green and blue color filters CF. Here, red and/or green color filters may be extended and formed on the regions in which the thin film transistors ST and DT are formed in the pixel region so as to cover the thin film transistors ST and DT. An overcoat layer OC for planarizing the substrate SUB is formed on an overall surface of the substrate SUB on which the color filters CF are formed.

The anode ANO and the bank BN are formed on the overcoat layer OC. The anode ANO is connected to the driving drain electrode DD of the driving thin film transistor DT through a pixel contact hole PH which penetrates the overcoat layer OC and the passivation layer PAS. Here, the storage capacitor STG is formed between the anode ANO and the storage capacitor lower electrode STU using the insulating layers interposed therebetween.

The bank BN is formed to define the shape of the anode ANO and the emission area AA. For example, the bank BN is formed to cover the edge of the anode ANO. The inside boundary IS of the bank BN is located on the anode ANO so as to come into contact with the upper surface of the anode ANO and the outside boundary OS thereof is located on the overcoat layer OC so as to come into contact with the upper surface of the overcoat layer OC. The outside boundary OS of the bank BN defines an area taking the same shape as the anode ANO and the inside boundary IS of the bank BN defines an area which exposes the emission area AA in the anode ANO in the plan view.

An organic emission layer OLE is formed on the exposed anode ANO and a cathode CAT is formed on the organic emission layer OLE to cover the same. In this manner, the organic light-emitting diode OLED including the anode ANO, the organic emission layer OLE and the cathode CAT is completed. Here, the organic light-emitting diode OLED is driven by being connected to the drain electrode DD of the driving thin film transistor DT.

A description will be given of a method for manufacturing an OLED display according to an embodiment of the present invention.

FIGS. 7 to 14 and FIGS. 15a to 15c are cross-sectional views illustrating a process of manufacturing an OLED display according to an embodiment of the present invention.

Figure 7:
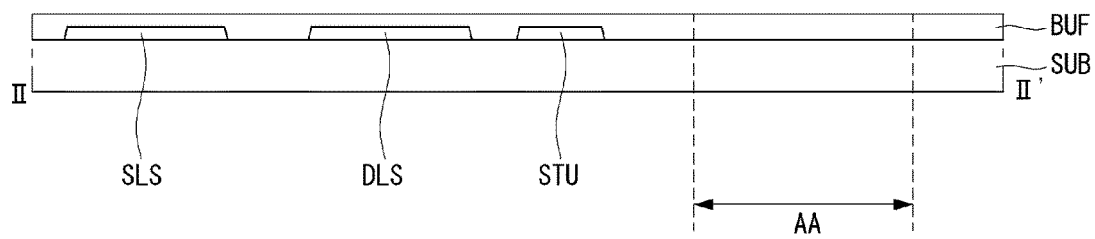
FIGS. 7 to 14 and 15a to 15c are cross-sectional views illustrating a process of manufacturing an organic light-emitting diode display according to an embodiment of the present invention.

Referring to FIG. 7, a light-shielding material which is opaque and has excellent light-shielding performance is coated on an overall surface of the substrate SUB. Alternatively, a metal material having high conductivity may be coated on the substrate SUB. The light-shielding material layer is patterned through a first mask process so as to form the light-shielding layers SLS and DLS. When the metal material is coated, the storage capacitor lower electrode STU for forming the storage capacitor may be formed along with the light-shielding layers SLS and DLS. The light-shielding layers SLS and DLS are preferably formed such that semiconductor layers of thin film transistors, particularly, channel regions, which will be formed later, are superposed thereon. The light-shielding layers SLS and DLS serve to protect oxide semiconductor elements from external light. An insulating material is coated on an overall surface of the substrate SUB on which the light-shielding layers SLS and DLS are formed so as to form the buffer layer BUF.

Figure 8:
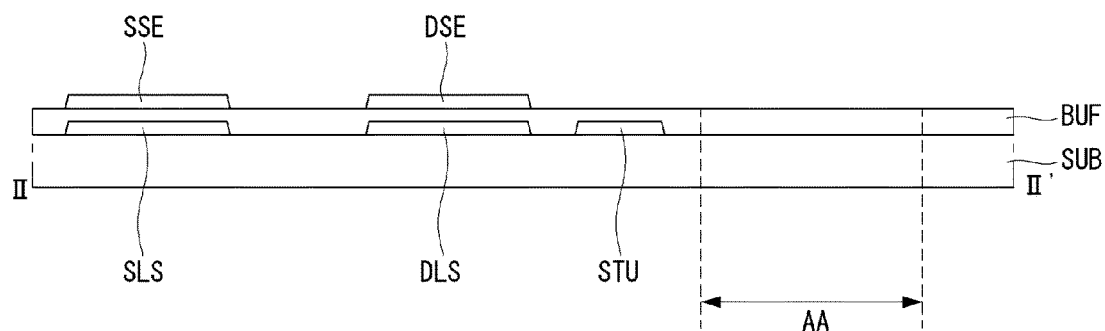

Referring to FIG. 8, a semiconductor material is coated on an overall surface of the substrate SUB on which the buffer layer BUF is formed. The semiconductor material may include an oxide semiconductor material such as indium gallium zinc oxide (IGZO). The semiconductor material layer is patterned through a second mask process so as to form the semiconductor layers SSE and DSE.

Figure 9:
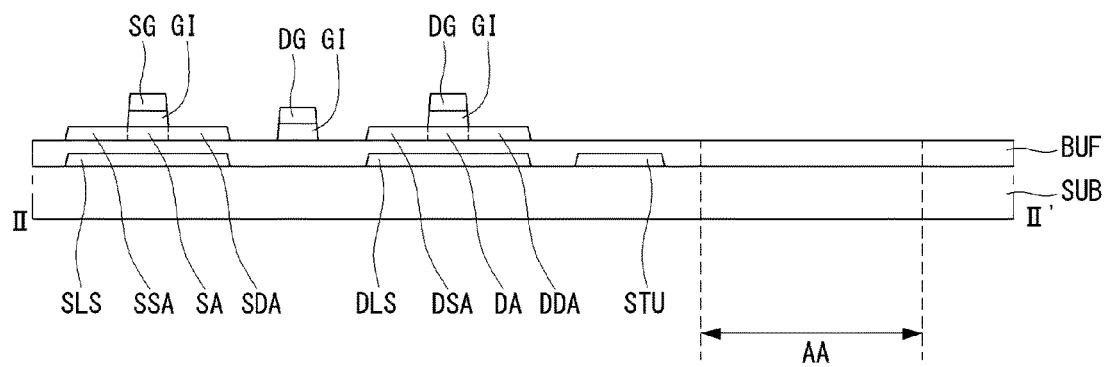

Referring to FIG. 9, an insulating material and a metal material are sequentially coated on an overall surface of the substrate SUB on which the semiconductor layers SSE and DSE are formed. The insulating material layer and the metal material layer are patterned through a third mask process so as to form the gate insulating layer GI and the gate electrodes SG and DG superposed thereon. The gate electrodes SG and DG are superposed on the center regions of the semiconductor layers and both sides of the semiconductor layers are exposed. The center regions of the semiconductor layers are respectively defined as a switching channel layer SA of the switching thin film transistor and a driving channel layer DA of the driving thin film transistor. The exposed regions of the semiconductor layers correspond to source regions SSA and DSA and drain regions SDA and DDA which respectively come into contact with the source electrodes and the drain electrodes of the switching thin film transistor and the driving thin film transistor. When the semiconductor material is an oxide semiconductor material, the source regions SSA and DSA and the drain regions SDA and DDA may have conductivity through a plasma treatment process.

Figure 10:
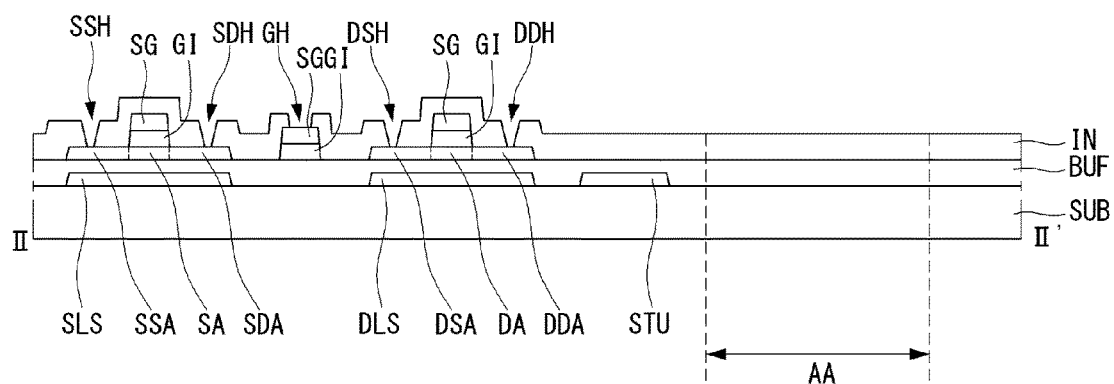

Referring to FIG. 10, an insulating layer is coated on an overall surface of the substrate SUB on which the gate electrodes SG and DG are formed so as to form the interlevel insulating layer IN. The interlevel insulating layer IN is patterned through a fourth mask process so as to form the contact holes SSH and DSH which expose the source regions SSA and DSA of the semiconductor layers and the contact holes SDH and DDH which expose the drain regions SDA and DDA of the semiconductor layers. Here, the gate contact hole GH which exposes part of the gate electrode DG of the driving thin film transistor is formed.

Figure 11:
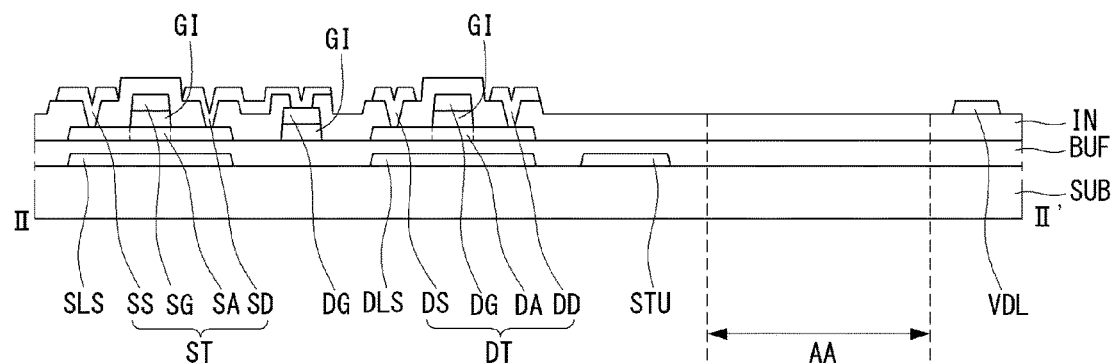

Referring to FIG. 11, a conductive material is coated on the interlevel insulating layer IN in which the contact holes are formed. The conductive material layer is patterned through a fifth mask process so as to form the driving current line VDL, the source electrode SS and the drain electrode SD of the switching thin film transistor ST and the source electrode DS and the drain electrode DD of the driving thin film transistor. Here, the drain electrode SD of the switching thin film transistor ST is connected to the gate electrode DG of the driving thin film transistor DT.

Figure 12:
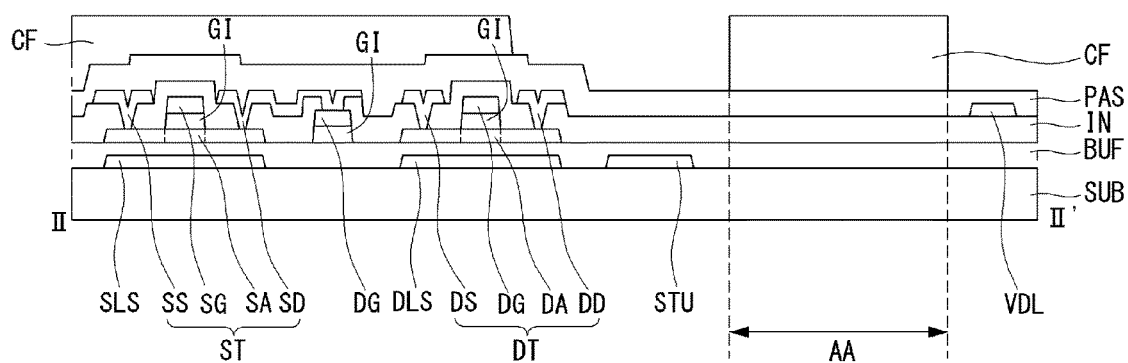

Referring to FIG. 12, an insulating material is coated on an overall surface of the substrate on which the thin film transistors ST and DT are formed so as to form the passivation layer PAS. Red, green and blue pigments are coated on the passivation layer PAS and patterned through sixth, seventh and eighth mask processes so as to sequentially form red, green and blue color filters CF. The red, green and blue color filters CF are respectively disposed in pixel regions for respectively expressing red, green and blue. Here, red and/or green color filters CF may be extended and formed on the region in which the thin film transistors ST and DT are formed in the pixel region so as to cover the thin film transistors ST and DT.

Figure 13:
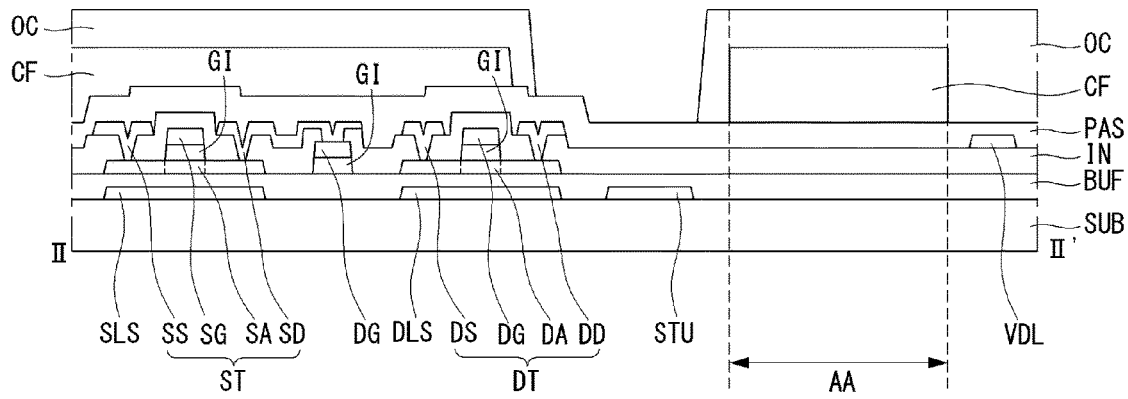

Referring to FIG. 13, an insulating material is coated on an overall surface of the substrate on which the color filters CF are formed so as to form the overcoat layer OC. The overcoat layer OC is patterned through a ninth mask process so as to expose portions of the passivation layer PAS, in which the pixel contact hole and the storage capacitor will be formed.

Figure 14:
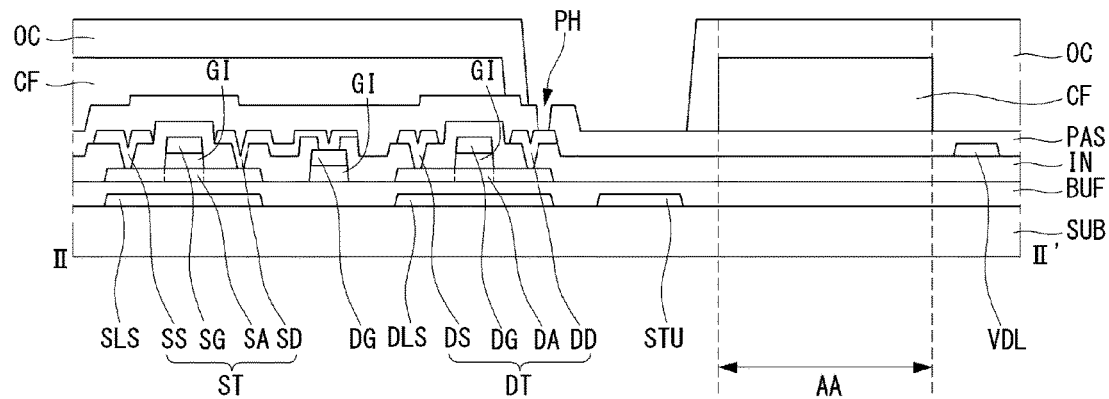

Referring to FIG. 14, the passivation layer PAS is patterned through a tenth mask process so as to form the pixel contact hole PH for exposing part of the drain electrode DD of the drain thin film transistor DT.

Figure 15A:
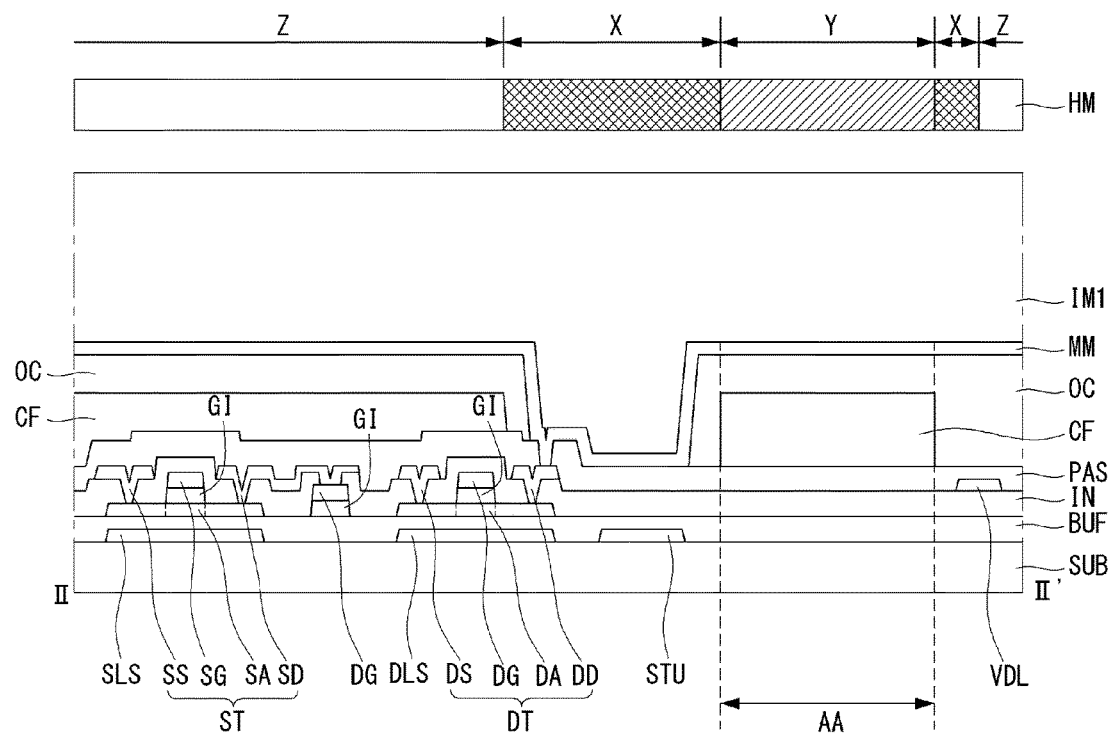
Figure 15B:
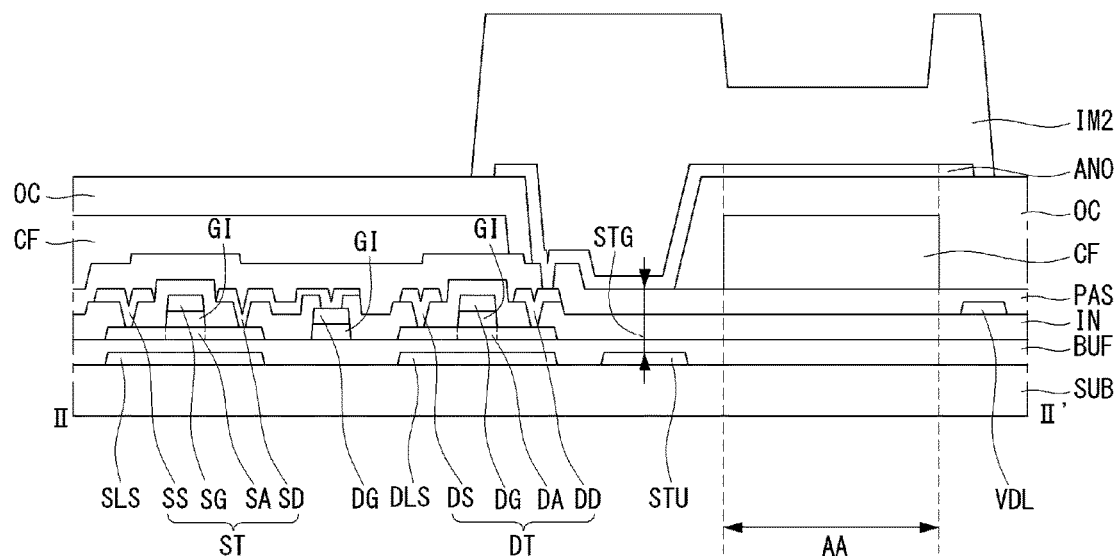
Figure 15C:
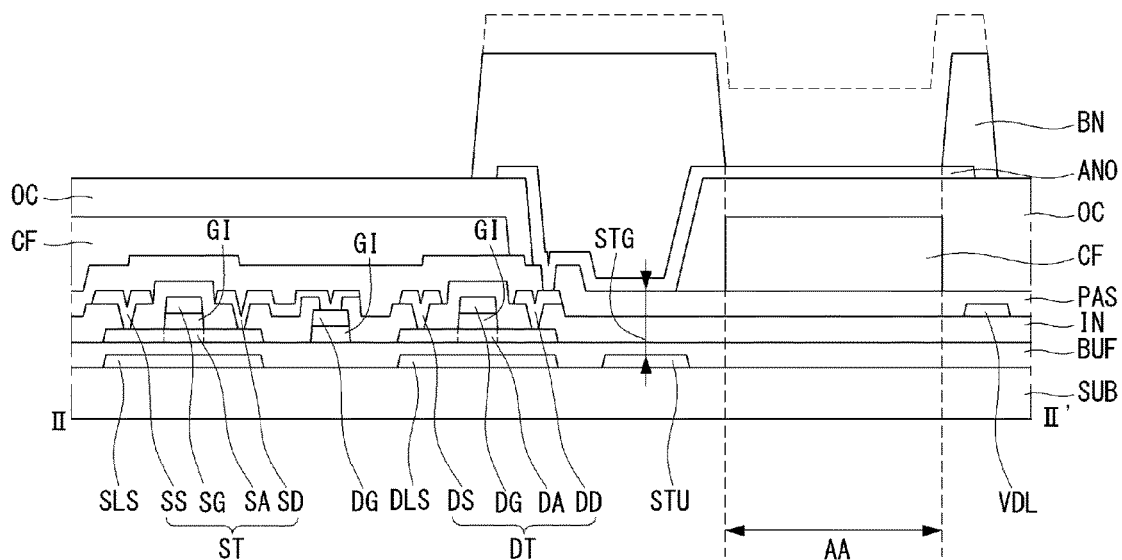

A description will be given of a process of forming the anode and the bank according to an embodiment of the present invention through a single mask process with reference to FIGS. 15a, 15b and 15c.

A conductive material MM and a photosensitive insulating material IM1 are sequentially coated on an overall surface of the substrate SUB so as to cover the passivation layer PAS and the overcoat layer OC. A half-tone mask HM is prepared in order to pattern the conductive material layer MM and the photosensitive insulating material layer IM1 through an eleventh mask process. The half-tone mask HM includes a full-tone area X for shielding light projected thereto, a half-tone area Y for transmitting part of light projected thereto and shielding part thereof, and an area Z for transmitting light projected thereto. Light is selectively projected through the half-tone mask HM. The photosensitive insulating material IM1 may be a positive type photoresist or a negative type photoresist. A description will be given of a case in which the photosensitive insulating material IIM1 is a positive type photoresist (FIG. 15a).

When the photosensitive insulating material IM1 exposed through the half-tone mask HM is developed, a portion of the photosensitive insulating material, which corresponds to the area Z, is removed and a portion IM2 of the photosensitive insulating material, which corresponds to the full-tone area X and the half-tone area Y, remains. Here, the portion of the photosensitive insulating material IM2, which corresponds to the full-tone area X, is thicker than the portion of the photosensitive insulating material IM2, which corresponds to the half-tone area Y. The metal material layer MM is patterned through a mask process using the remaining photosensitive insulating material IM2 so as to form the anode ANO. Here, the edge of the anode ANO, which defines the shape of the anode ANO, may be under-cut under the remaining photosensitive insulating material IM2. Subsequently, the remaining photosensitive insulating material IM2 reflows through curing so as to cover the edge of the anode ANO (FIG. 15b).

Then, ashing is performed so as to remove the remaining photosensitive insulating material layer IM2 by a predetermined thickness such that only the photosensitive insulating material of the full-tone area X remains. The remaining photosensitive insulating material becomes the bank BN. Here, most of the center portion of the anode ANO is exposed to serve as the emission area AA. The bank BN is formed to cover the edge of the anode ANO. That is, the bank BN has the inside boundary IS at a predetermined distance from the edge of the anode ANO and the outside boundary OS at a predetermined distance from the edge of the anode ANO (FIG. 15c).

The insulating material for forming the bank BN has photosensitivity and functions as a photoresist during the mask process. The present embodiment simultaneously forms the anode ANO and the bank BN through a single mask process using an insulating material having a photosensitivity.

Accordingly, the present embodiment can simplify the manufacturing process and reduce manufacturing time and costs by decreasing the number of mask processes for manufacturing the organic light-emitting diode display. In addition, the present embodiment can improve production yield by decreasing defect generation rate.

A description will be given of a bank structure according to an embodiment of the present invention with reference to FIGS. 16a and 16b.

Figure 16A:
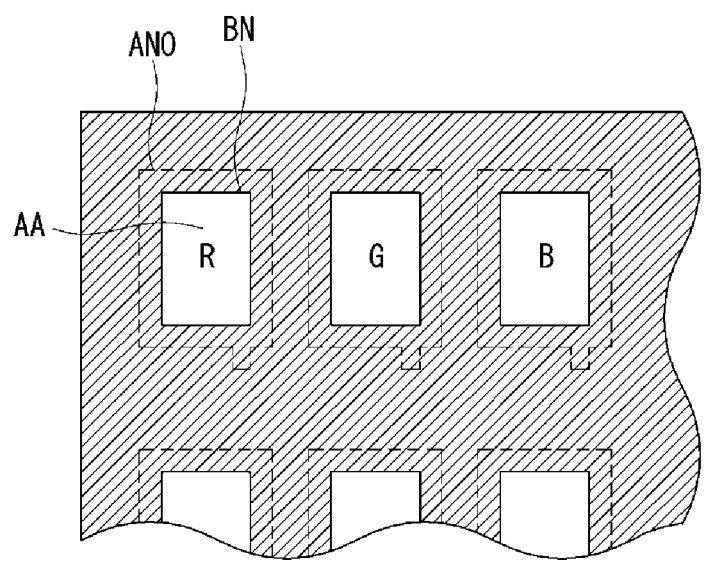
FIGS. 16a and 16b are views for comparing a bank structure according to an embodiment of the present invention with a conventional one.
Figure 16B:
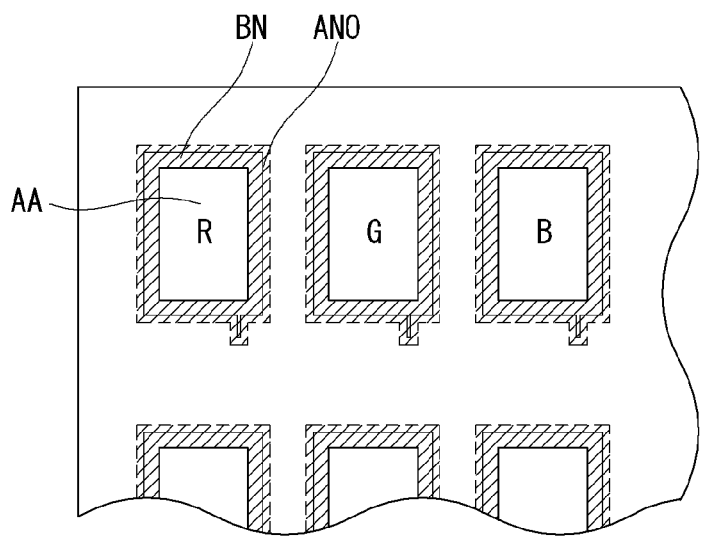

FIGS. 16a and 16b are views for comparing a bank structure according to an embodiment of the present invention with a conventional bank structure.

A bank in a conventional OLED display is formed on the overall surface of the substrate, exposing most of the center portion of the anode ANO. Most of the center portion of the anode ANO, exposed by the bank BN, serves as the emission area AA. That is, the conventional bank BN is formed on the area (represented as a shaded area in the figure) of the substrate, except the emission area AA (FIG. 16a).

The bank BN in the OLED display according to an embodiment of the present invention is formed to cover the edge of the anode ANO, exposing most of the center portion of the anode ANO. Most of the center portion of the anode ANO, exposed by the bank BN, serves as the emission area AA. Accordingly, the bank BN is formed to cover the edge of the anode ANO, except the emission area AA, and thus the bank BN has an island shape with an opening region at the center thereof, which exposes the emission area AA (FIG. 16b).

As described above, an embodiment of the present invention forms the anode ANO and the bank BN through a single mask process using an insulating material having a photosensitivity. It would be appreciated that structures and processes prior to formation of the anode ANO are not limited to the aforementioned embodiments, and embodiments of the present invention can include various types of structures and processes for driving an organic light-emitting diode.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A method for manufacturing an organic light-emitting diode display, comprising:
    forming a storage capacitor lower electrode and a light-shielding layer on a substrate;
    forming a thin film transistor overlapping the light-shielding layer on a substrate;
    forming a passivation layer covering the thin film transistor;
    forming an overcoat layer covering the passivation layer and having a contact hole exposing a part of the passivation layer;
    forming a pixel contact hole partially exposing the thin film transistor inside the contact hole;
    sequentially providing an anode material and a photosensitive insulating material on the part of the passivation layer inside the contact hole and on the overcoat layer outside the contact hole, and patterning the anode material and the photosensitive insulating material in a single mask process to form an anode connected to the thin film transistor through the pixel contact hole, such that the storage capacitor lower electrode corresponds with the anode to form a storage capacitor between the storage capacitor lower electrode and the anode; and
    removing the photosensitive insulating material to form a bank exposing a part of the anode and covering the storage capacitor,
    wherein the bank has an island shape with an opening region at the center thereof, which exposes an emission area,
    wherein, inside the contact hole, the anode on the part of the passivation layer overlaps with the storage capacitor lower electrode on the substrate and the passivation layer is interposed therebetween to form the storage capacitor, and
    wherein the light-shielding layer and the storage capacitor lower electrode are disposed on a same layer.

2. The method of claim 1, wherein the forming of the bank is such that the bank covers an edge of the anode and has an inside boundary at a first distance from the edge of the anode and an outside boundary at a second distance from the edge of the anode.

3. The method of claim 1, further comprising curing the photosensitive insulating material such that the photosensitive insulating material covers the edge of the anode, after the forming of the anode and prior to the forming of the bank.

4. The method of claim 2 wherein the forming of the bank is such that the inside boundary of the bank is located on the anode and the outside boundary of the bank is located on the overcoat layer.

* * * * *